(12) United States Patent
Holzmann

(10) Patent No.: US 11,349,441 B2
(45) Date of Patent: May 31, 2022

(54) METHOD AND APPARATUS OF ADAPTIVE GATE BIAS FOR SWITCHED DRIVER

(71) Applicant: Nuvoton Technology Corporation, Hsinchu (TW)

(72) Inventor: Peter Holzmann, San Jose, CA (US)

(73) Assignee: NUVOTON TECHNOLOGY CORPORATION, Hsinchu (TW)

(*) Notice: Subject to any disclaimer, the term of this patent is extended or adjusted under 35 U.S.C. 154(b) by 237 days.

(21) Appl. No.: 16/745,370

(22) Filed: Jan. 17, 2020

(65) Prior Publication Data
US 2021/0226592 A1 Jul. 22, 2021

(51) Int. Cl.
| | | |
|---|---|---|
| *H03F 3/217* | (2006.01) | |
| *H03F 3/185* | (2006.01) | |
| *H02M 7/12* | (2006.01) | |
| *H03M 1/66* | (2006.01) | |

(52) U.S. Cl.
CPC ............ *H03F 3/2171* (2013.01); *H02M 7/12* (2013.01); *H03F 3/185* (2013.01); *H03M 1/66* (2013.01)

(58) Field of Classification Search
CPC .... H03F 3/2171; H03F 3/185; H03F 2200/03; H03F 1/0266; H03F 3/2173; H03F 3/2175; H03F 1/0211; H03F 2200/351; H03F 3/217; H02M 7/12; H02M 1/08; H03M 1/66; H04R 3/00

USPC .............................................. 330/207 A, 251
See application file for complete search history.

(56) References Cited

U.S. PATENT DOCUMENTS

| | | | | |
|---|---|---|---|---|
| 5,838,193 A | * | 11/1998 | Myers .................... | H03F 3/2171 330/10 |
| 9,292,028 B2 | * | 3/2016 | Capodivacca ..... | H05B 45/3725 |
| 10,224,804 B1 | * | 3/2019 | Hsing ................. | H02M 7/5395 |
| 2009/0096511 A1 | * | 4/2009 | Ueunten .............. | H03K 17/122 327/543 |
| 2011/0188218 A1 | * | 8/2011 | Hsing .................. | H03K 17/687 361/772 |
| 2016/0132084 A1 | * | 5/2016 | Solki ..................... | G06F 1/3296 713/320 |

* cited by examiner

*Primary Examiner* — Khanh V Nguyen
(74) *Attorney, Agent, or Firm* — Kilpatrick Townsend & Stockton LLP

(57) ABSTRACT

An audio driver circuit includes a modulator circuit configured to receive an audio input signal and produce a first modulated digital pulse signal. The first modulated digital pulse signal has a magnitude that switches between a supply power voltage and a supply ground voltage. The audio driver circuit also includes a switched driver circuit coupled to the modulator circuit to receive the first modulated digital pulse signal and configured to provide a second modulated digital pulse signal for driving an MOS (metal oxide semiconductor) output transistor. The second modulated digital pulse signal has a same timing pattern as the first modulated digital pulse signal and has a magnitude that tracks linearly with the magnitude of the audio input signal.

20 Claims, 12 Drawing Sheets

METHOD AND APPARATUS OF ADAPTIVE GATE BIAS FOR SWITCHED DRIVER

BACKGROUND OF THE INVENTION

This invention relates to the field of electronic circuits in audio systems. More particularly, the present invention relates to efficient speaker drivers for audio applications. Embodiments of the invention can also be applied to efficient power conversion circuits.

A class-D amplifier, also known as a switching amplifier, is an electronic amplifier in which all transistors operate as binary switches. They are either fully on or fully off. CLASS-D amplifiers employ rail-to-rail output switching, where, ideally, their output transistors virtually always carry either zero current or zero voltage. Thus, their power dissipation is minimal, and they provide high efficiency over a wide range of power levels. Their advantageous high efficiency has propelled their use in various audio applications, from cell phones to flat screen televisions and home theater receivers. Class-D audio power amplifiers are more efficient than class-AB audio power amplifiers. Because of their greater efficiency, class-D amplifiers require smaller power supplies and eliminate heat sinks, significantly reducing overall system costs, size and weight.

Class D audio power amplifiers convert audio signals into high-frequency pulses that switch the output in accordance with the audio input signal. Some class D amplifier use pulse width modulators (PWM) to generate a series of conditioning pulses that vary in width with the audio signal's amplitude. The varying-width pulses switch the power-output transistors at a fixed frequency. Other class D amplifiers may rely upon other types of pulse modulators. The following discussion will mainly refer to pulse width modulators, but those skilled in the art will recognize that class D amplifiers may be configured with other types of modulators.

FIG. 1 is a simplified schematic diagram illustrating a conventional class-D amplifier 100. The differential input audio signals INP and INM are input to comparators 101 and 102, where input signals INP and INM are compared triangular waves VREF generated from an oscillator 103 to generate PWM signals 106 and 107. PWM signals 106 and 107 are coupled to the gates of transistors M1, M2, M3, and M4, respectively. Differential output signals OUTM and OUTP of the class D amplifier are respectively provided at terminals also labeled OUTM and OUTP. As shown in FIG. 1, output signals OUTM and OUTP are connected to a speaker load 110, which is represented by an inductor L1 and a resistor R1.

FIG. 2 is a waveform diagram illustrating the modulation of signals in the class-D amplifier of FIG. 1. As shown in FIG. 2, differential input signals, e.g., audio signals INM and INP, are compared with a triangular reference waveform by two comparators as described above in connection with FIG. 1. The output signals of the comparators are pulse signals at a fixed frequency whose pulse width is proportional to the input signal. Two PWM signals are shown in FIG. 2 as OUTP and OUTM.

The traditional class D amplifiers have outputs (OUTP and OUTM) that have a swing range from ground Vss to Vdd. As explained in more detail below, traditional class D amplifiers tend to have low power efficiency in audio applications.

BRIEF SUMMARY OF THE INVENTION

The inventor has observed that in audio applications, music signals often have a large crest factor (peak to RMS ratio), which can be in the order of 10 to 20 dB. This means that when playing an audio file through an amplifier to a speaker, most of the time power is consumed at the lower power levels and occasionally at the peak power level. Therefore, the total energy consumed during playback is strongly dependent on the amplifier power efficiency at the lower output power levels. Compared with a class-AB driver, a class-D driver suffers from switching losses at low signal levels due to the charging and discharging of the switched gates. To resolve this issue, various embodiments of this invention address the efficiency of a switching driver stage at lower output power levels.

According to some embodiments of the present invention, an audio driver circuit includes a modulator circuit configured to receive an audio input signal and a switched driver circuit for driving an MOS (metal oxide semiconductor) output transistor. The modulator circuit includes a digital-to-analog converter (DAC) circuit for receiving a digital representation of an audio input voltage signal and outputting an analog audio input signal, and a class-D PWM (pulse width modulation) modulator configured for receiving the analog audio input signal and generating a first PWM signal. The first PWM signal has a magnitude switching between a supply power voltage and a supply ground voltage. The switched driver circuit, for driving an MOS (metal oxide semiconductor) output transistor, has a source node coupled to either the supply power voltage or the supply ground voltage and a drain node coupled to an audio driver output node. The switched driver circuit is coupled to the audio input voltage signal and the modulator circuit. The switched driver circuit includes a digital-to-analog current converter (IDAC) circuit configured to provide a current signal proportional to the magnitude of the audio input voltage signal, and an MOS transistor and a resistor coupled in series to receive the current signal. The switched driver circuit is configured to provide a gate bias voltage to a gate node of the MOS output transistor, wherein the gate bias voltage is a second PWM signal that has a same timing pattern as the first PWM signal and has a magnitude that is linearly proportional to the magnitude of the audio input voltage signal.

In some embodiments of the above audio driver circuit, the gate bias voltage is expressed as:

$$I*R+Vt;$$

where:

I is the IDAC output current;

R is the resistance of the resistor; and

Vt is a threshold voltage, equivalent to the threshold voltage of the MOS output transistor.

In some embodiments, the switched driver circuit also includes a rectifier for receiving a digital representation of the audio input signal and outputting an absolute value of the audio input signal, and a hold-and-release circuit for keeping the absolute value of the audio input signal at a peak level for a given hold time before releasing the absolute value of the audio input signal to the digital-to-analog current converter (IDAC).

According to some embodiments of the present invention, an audio driver circuit includes a modulator circuit configured to receive an audio input signal and produce a first modulated digital pulse signal. The first modulated digital pulse signal has a magnitude that switches between a supply power voltage and a supply ground voltage. The audio driver circuit also includes a switched driver circuit coupled to the modulator circuit to receive the first modulated digital pulse signal and configured to provide a second modulated digital pulse signal for driving an MOS (metal oxide semiconductor) output transistor. The second modulated digital pulse signal has a same timing pattern as the first modulated digital pulse signal and has a magnitude that tracks linearly with the magnitude of the audio input signal.

In some embodiments, the magnitude of the second PWM signal is low at low audio input voltage, and thereby is configured to improve power efficiency at low output power levels. In some embodiments, the switched driver circuit is configured for driving an NMOS output transistor and a PMOS transistor.

In some embodiments, the first modulated digital pulse signal and the second modulated digital pulse signal are pulse width modulation (PWM) signals. In some embodiments, the first modulated digital pulse signal and the second modulated digital pulse signal are pulse frequency modulation (PFM) signals.

In some embodiments, the switched driver circuit is configured to provide a current signal through a serially-coupled MOS transistor and resistor pair to produce a voltage signal, wherein the current signal is proportional to the audio input signal, and the voltage signal is expressed as:

I*R+Vt;

where:
I is the current proportional to the audio input signal;
R is the resistance of the resistor; and
Vt is a threshold voltage, equivalent to the threshold voltage of the MOS output transistor.

In some embodiments, the switched driver circuit includes a bias circuit configured to generate the voltage signal expressed as I*R+Vt, and a gate driver circuit configured to receive the voltage signal from the bias circuit and to provide the second modulated digital signal.

In some embodiments, the bias circuit includes a first bias circuit coupled to a first gate driver circuit for providing a first gate driver voltage to an NMOS output transistor, and a second bias circuit coupled to a second gate driver circuit for providing a second gate driver voltage to a PMOS output transistor.

In some embodiments, the first bias circuit includes a first NMOS transistor Mn1, a second NMOS transistor Mn2, and a first resistor Rn connected in series, each of the first NMOS transistor Mn1 and the second NMOS transistor Mn2 being a diode-connected NMOS transistor with a gate node connected to a drain node. The second bias circuit comprises a first PMOS transistor Mp1, a second PMOS transistor Mp2, and a second resistor Rp connected in series, each of the first PMOS transistor Mp1 and the second PMOS transistor Mp2 being a diode-connected NMOS transistor with a gate nodes connected to a drain node.

In some embodiments, the first gate driver circuit includes a fifth PMOS transistor Mp5, a third NMOS transistor Mn3, and a fourth NMOS transistor Mn4 connected in series, and a sixth PMOS transistor Mp6. A gate node of the third NMOS transistor Mn3 is coupled to a gate node of the first NMOS transistor Mn1; a drain node of the fifth PMOS transistor Mp5 is coupled to a source of the sixth PMOS transistor Mp6; a source node of third NMOS transistor Mn3 is coupled to a first output terminal Mn Gate for providing the first gate driver voltage; and a drain node of the sixth PMOS transistor Mp6 is coupled to the first output terminal.

The second gate driver circuit includes a fifth NMOS transistor Mn5, a third PMOS transistor Mp3, and a fourth PMOS transistor Mp4 connected in series, and a sixth NMOS transistor Mn6. A gate node of the third PMOS transistor Mp3 is coupled to a gate node of the first PMOS transistor Mp1; a source node of third PMOS transistor Mp3 is coupled to a second output terminal (Mp Gate) for providing the second gate driver voltage; a drain node of the fifth NMOS transistor Mn5 is coupled to a source of the sixth NMOS transistor Mn6; a source node of third PMOS transistor Mp3 is coupled to a second output terminal (Mp Gate) for providing the second gate driver voltage; and a drain node of the sixth PMOS transistor Mp6 is coupled to the first output terminal.

In some embodiments, a threshold voltage of the second NMOS transistor Mn2 is configured to match a threshold voltage of a first output transistor Mn; and a threshold voltage of the second PMOS transistor Mp2 is configured to match a threshold voltage of a first second transistor Mp.

In some embodiments, the bias circuit further includes a rectifier for receiving a digital representation of the audio input signal and outputting an absolute value of the audio input signal; and a digital-to-analog current converter (IDAC) for providing a first analog current signal In and a second analog current signal Ip based on the absolute value of the audio input signal.

According to some embodiments of the present invention, a method for providing an audio driver signal to an output transistor includes receiving an audio input signal, at a modulator circuit, and producing a first modulated digital pulse signal. The first modulated digital pulse signal has a magnitude that switches between a supply power voltage and a supply ground voltage. The method also includes receiving, at a switched driver circuit, the first modulated digital pulse signal and providing a second modulated digital pulse signal for driving an output transistor. The second modulated digital pulse signal has a same timing pattern as the first modulated digital pulse signal and has a magnitude that tracks linearly with the magnitude of the audio input signal.

Various additional objects, features, and advantages of the present invention can be more fully appreciated with reference to the detailed description and accompanying drawings that follow.

DETAILED DESCRIPTION OF THE INVENTION

Figure 1:
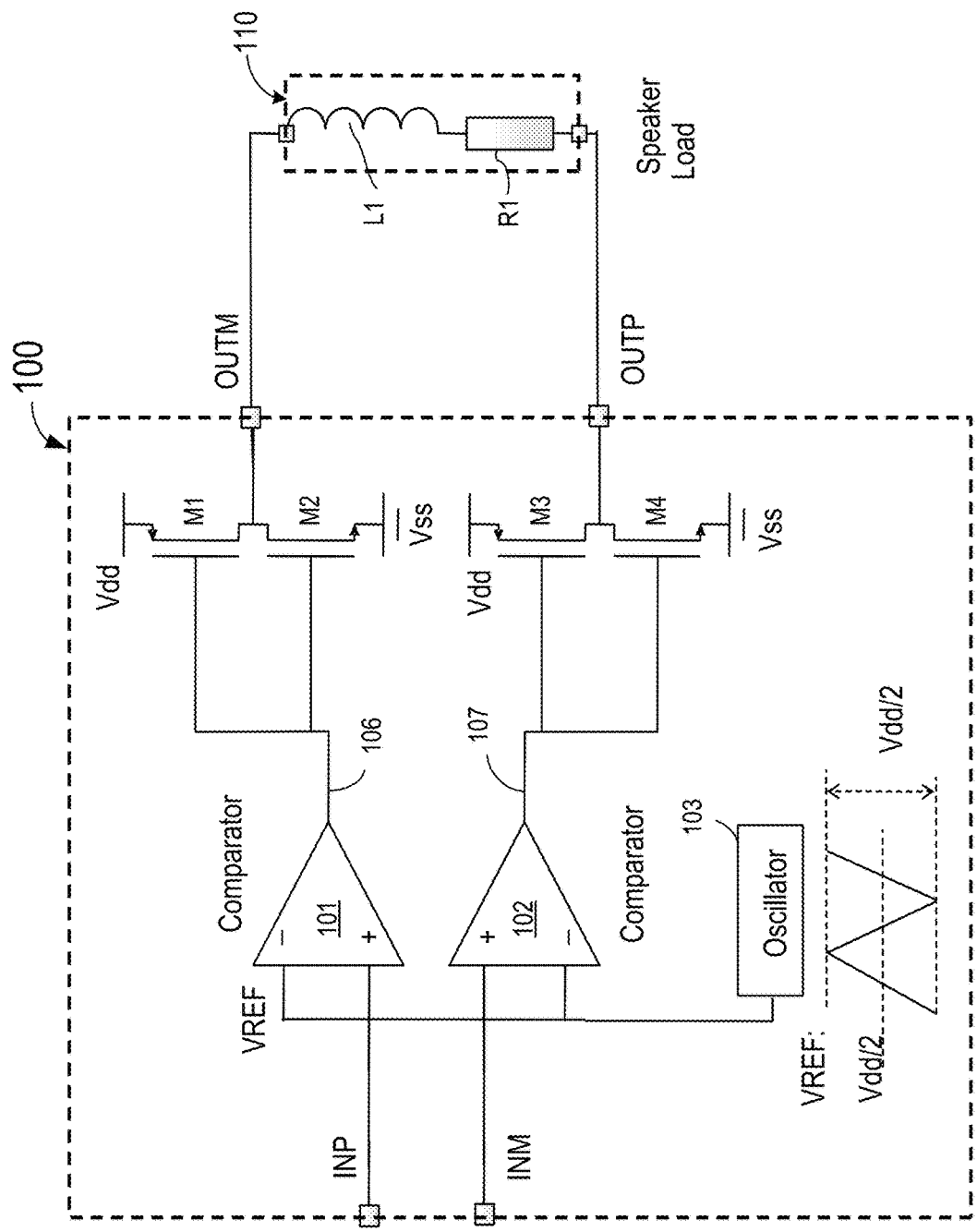
FIG. 1 is a simplified schematic diagram illustrating a conventional class-D amplifier.
Figure 2:
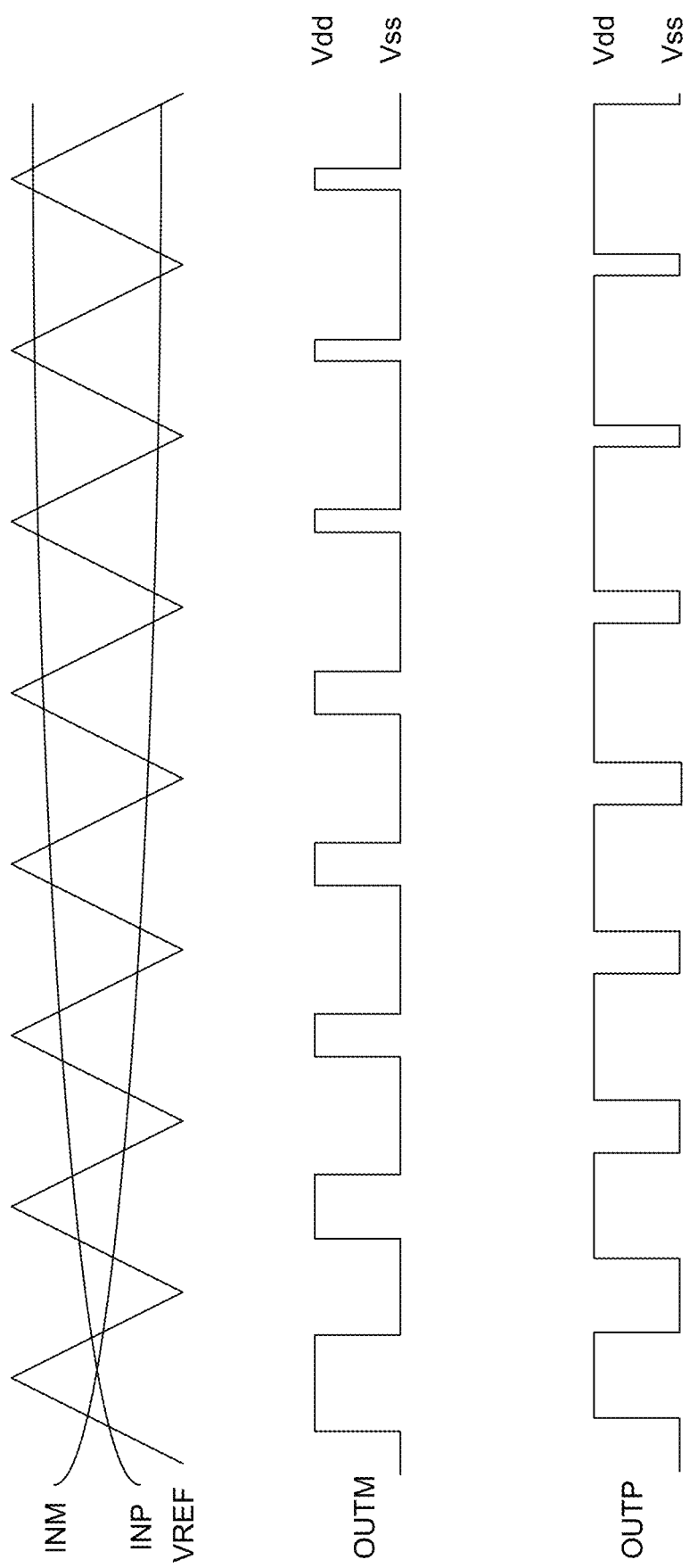
FIG. 2 is a waveform diagram illustrating the modulation of signals in the class-D amplifier of FIG. 1.
Figure 3:
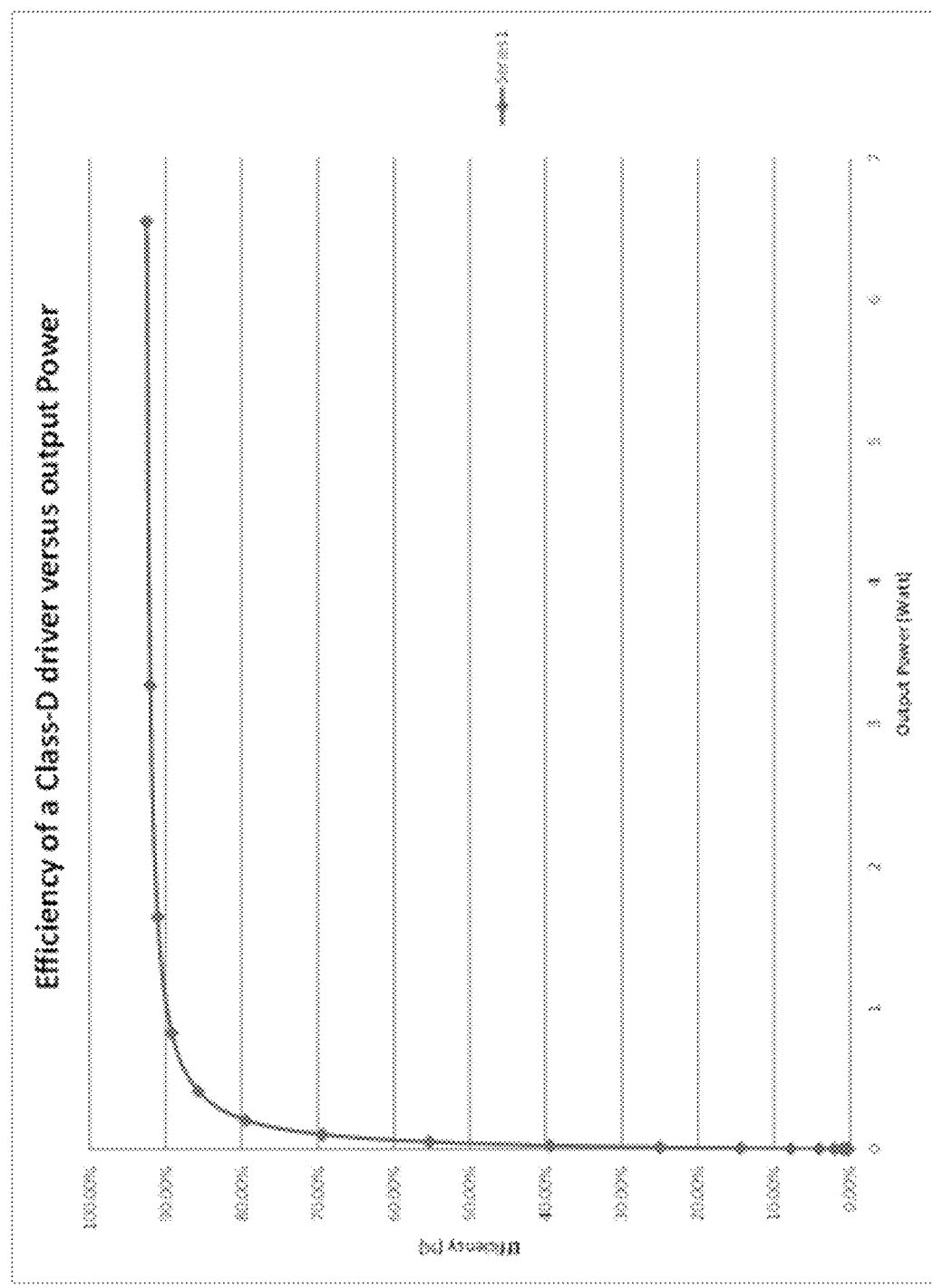
FIG. 3 a diagram illustrating power efficiency of a class-D driver versus the output power plotted in a linear scale according to an embodiment of the present invention.
Figure 4:
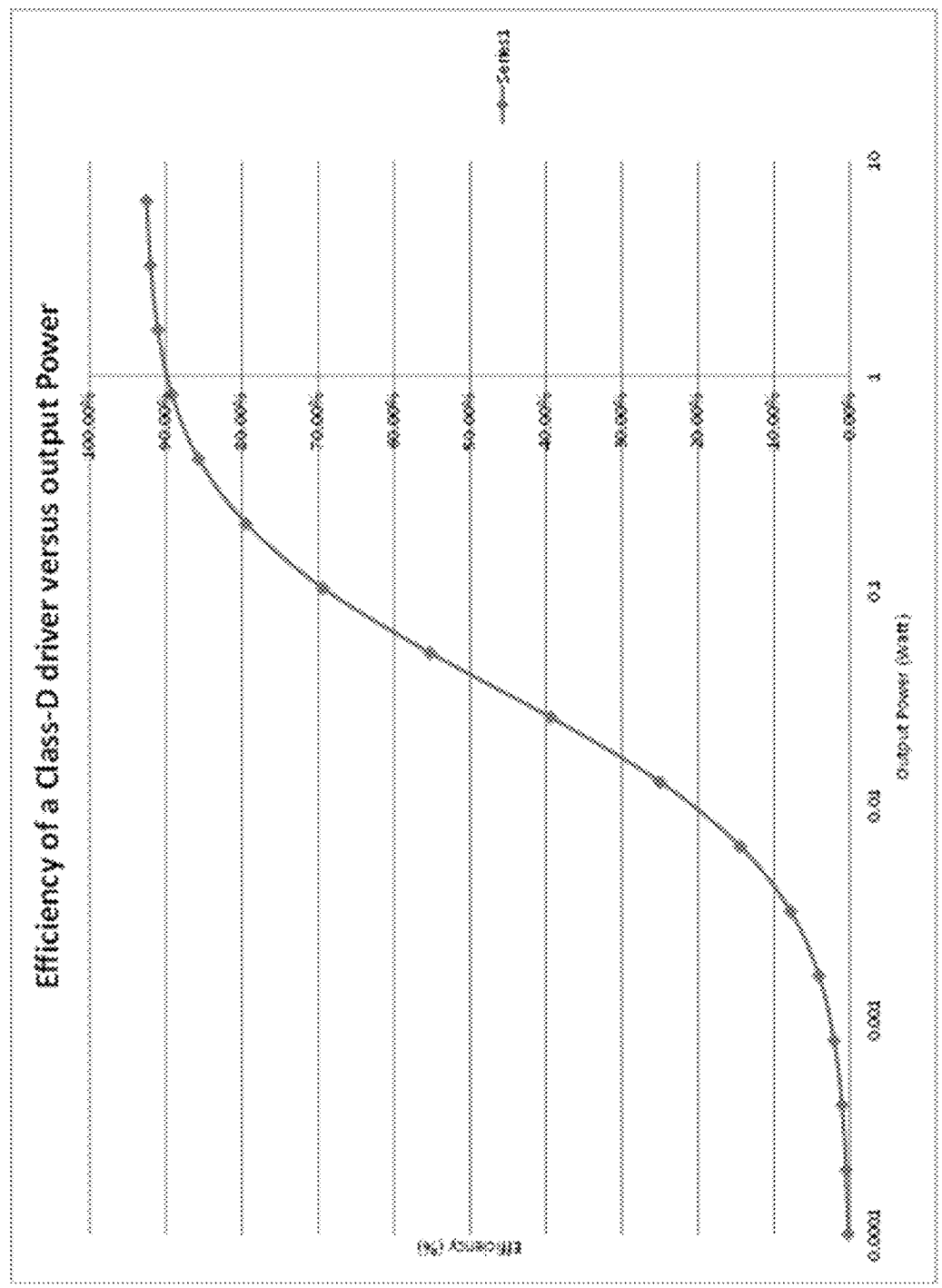
FIG. 4 is a diagram illustrating power efficiency of a class-D driver versus the output power plotted in a logarithmic scale according to an embodiment of the present invention.

FIG. 3 a diagram illustrating power efficiency of a class-D driver versus the output power plotted in a linear scale according to an embodiment of the present invention, and FIG. 4 is a diagram illustrating power efficiency of a class-D driver versus the output power plotted in a logarithmic scale according to an embodiment of the present invention. The low efficiency of a switching driver stage at lower output power levels, as described above, is typically plotted with power on a linear scale, such as in FIG. 3. The effect can be more clearly seen when showing the curve of efficiency versus power of a class-D driver stage with the power axis on a linear scale as well as on a logarithmic scale, such as in FIG. 4. In the logarithmic scale, the actual efficiency at lower levels becomes more visible.

Figure 5:
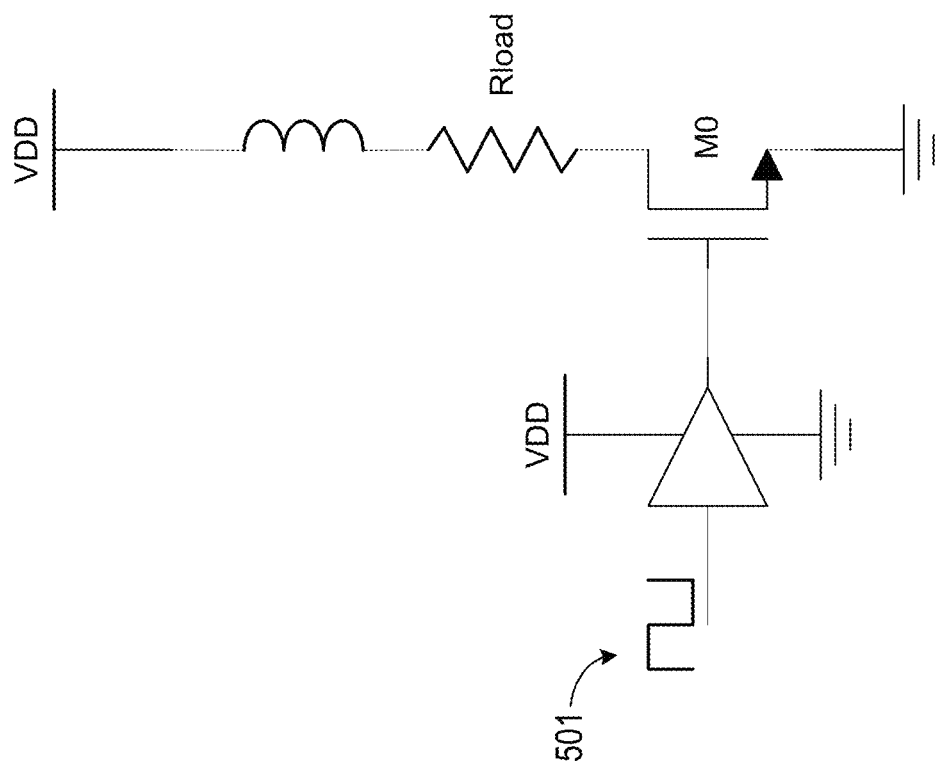
FIG. 5 is a simplified circuit diagram of a class-D driver for explaining the efficiency curve according to an embodiment of the present invention.

FIG. 5 is a simplified circuit diagram of a class-D driver for explaining the efficiency curve according to an embodiment of the present invention. In FIG. 5, an NMOS transistor M0 drives an inductive load $R_{LOAD}$. The NMOS transistor gate is driven by a switched gate driver, in which an input signal 501 is derived from a pulse width modulator. At high signal levels when the NMOS is completely turned on, the efficiency loss contribution is largely due to the on-resistance $R_{SWITCH}$ of the NMOS transistor. It can be calculated as:

$$\frac{P_{OUT}}{P_{IN}} = \eta = \frac{R_{LOAD}}{R_{LOAD} + R_{SWITCH}}.$$

As the size of the NMOS output driver becomes bigger, the $R_{SWITCH}$ reduces, and the efficiency becomes better.

At low power levels, the NMOS driver is off most of the time, but the gate is still switching on and off for small durations within the switching period. Therefore, power is dissipated due to the switching of the parasitic gate capacitance of the NMOS driver. The switching power can be calculated as:

$$P_{SWLOSS} = C_{GS} \cdot V_{DD} \cdot V_{DD} \cdot F_{SW}$$

where:
$P_{SWLOSS}$ is switching power loss;
$C_{GS}$ is the gate-source capacitance;
$V_{DD}$ is the power supply voltage; and
$F_{SW}$ is the switching frequency.

As can be seen from the above equation, a better switching efficiency at low power levels can be obtained with a smaller gate-source capacitance and, therefore, a smaller driver. However, a smaller driver can negatively impact the efficiency loss at higher power levels due to the larger on-resistance $R_{SWITCH}$.

As described above, the efficiency at lower levels is important for audio drivers as the crest factor of music is high. This means that most of the energy is consumed at lower output levels. Therefore, in order to reduce the energy consumed by the output driver stage, a driver with a higher efficiency at low output power levels, while maintaining the class-D efficiency at the higher output levels, is desired.

Some embodiments of the invention described here use an adaptive bias circuit derived from the input voltage or a digital input representation in order to reduce the switching losses. Reducing the switched gate voltage at low output power levels while maximizing at high output power levels can improve the overall efficiency of the driver.

As shown above, the efficiency of switching drivers can be expressed as follows:

$$\frac{P_{OUT}}{P_{IN}} = \eta = \frac{R_{LOAD}}{R_{LOAD} + R_{SWITCH}}$$

The on-resistance of the switch $R_{SWITCH}$ can be expressed as follow:

$$R_{SWITCH} = \frac{R_{NOM} \cdot (V_{NOM} - V_T)}{(V_{GS} - V_T)}$$

where Vnom is the nominal supply voltage, and Rnom is the nominal drain-to-source resistance or switch resistance of transistor M0, when Vgs is at the nominal supply voltage Vnom.

The switching losses can be expressed as follows:

$$P_{SWLOSS} = C_{GS} \cdot V_{DD} \cdot V_{DD} \cdot F_{SW}$$

Combining the above equations, the actual input power $P_{INtotal}$ can be expressed as follows:

$$P_{INtotal} = \frac{P_{OUT}}{\eta} + P_{SWLOSS}$$

$$P_{INtotal} = P_{OUT} \cdot \left(1 + \frac{R_{NOM} \cdot (V_{NOM} - V_T)}{R_{LOAD} \cdot (V_{GS} - V_T)}\right) + C_{GS} \cdot V_{NOM} \cdot V_{GS} \cdot F_{SW}.$$

The equation can be simplified using the following substitutions:

$$x = (V_{GS} - V_T)$$

$$\alpha = \frac{R_{NOM} \cdot (V_{NOM} - V_T)}{R_{LOAD}}$$

$$\beta = C_{GS} \cdot V_{NOM} \cdot F_{SW}.$$

It results in the following relationship:

$$P_{INtotal} = P_{OUT} \cdot \left(1 + \frac{\alpha}{x}\right) + \beta \cdot V_T + \beta \cdot x.$$

In the above equation, x is a variable, and the other terms are fixed.

The optimal power point is obtained when the following condition is met:

$$\frac{dP_{IN}}{dx} = 0$$

$$-P_{OUT} \cdot \left(\frac{\alpha}{x^2}\right) + \beta = 0$$

$$x = \sqrt{\frac{P_{OUT} \cdot \alpha}{\beta}}$$

$$V_{GS} = \sqrt{\frac{P_{OUT} \cdot \alpha}{\beta}} + V_T$$

$$V_{GS} = \sqrt{\frac{P_{OUT} \cdot R_{NOM} \cdot (V_{NOM} - V_T)}{R_{LOAD} \cdot C_{GS} \cdot V_{NOM} \cdot F_{SW}}} + V_T$$

$$V_{GS} = \frac{V_{OUT}}{R_{LOAD}} \cdot \sqrt{\frac{R_{NOM} \cdot (V_{NOM} - V_T)}{C_{GS} \cdot V_{NOM} \cdot F_{SW}}} + V_T$$

As shown in the above equation, the optimum $V_{GS}$ that minimizes the power is proportional to Vout, other terms being constant. In a linear amplifier, Vout is proportional to Vin. This condition is generally held true, as high linearity is a requirement for speaker amplifiers. Therefore, in some embodiments of the present invention, the optimum $V_{GS}$ is set to be proportional to Vin. Further, as Vin varies, the optimum $V_{GS}$ is configured to track Vin. Thus, the optimum $V_{GS}$ that minimizes the power can be expressed as follows.

I*R+Vt wherein:
I is the IDAC output current, linearly proportional to the magnitude of Vin;
R is the resistance of the resistor; and
Vt is a threshold voltage, equivalent to the threshold voltage of the MOS output transistor.

Figure 6:
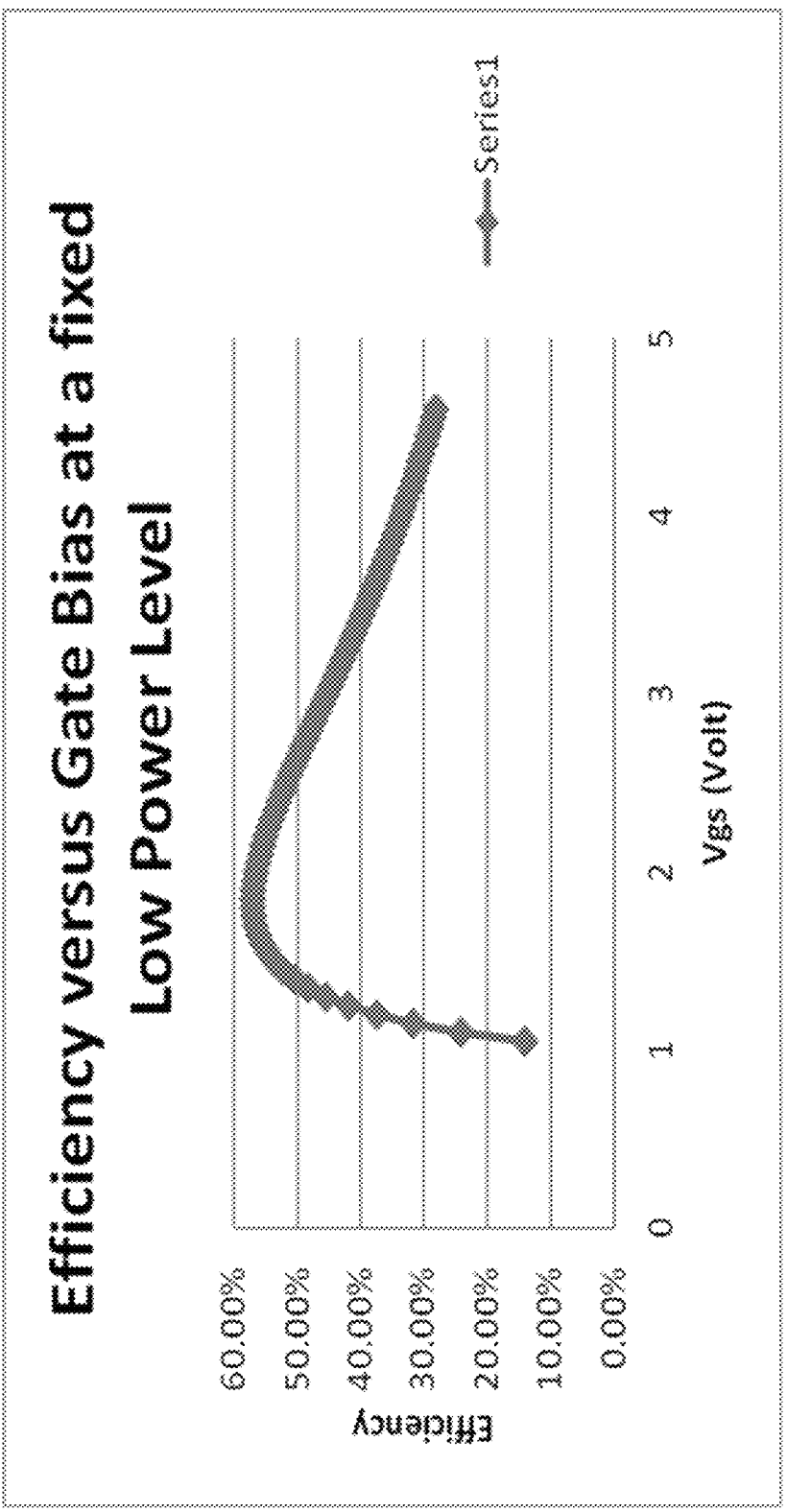
FIG. 6 is a diagram of simulated data illustrating the efficiency of a driver circuit versus gate bias at a given output power in the lower power region according to an embodiment of the present invention.

FIG. 6 is a diagram of simulated data illustrating the efficiency of a driver circuit versus gate bias at a given output power in the lower power region according to an embodiment of the present invention. As shown, there is an optimal bias voltage Vgs to achieve an optimal power efficiency, confirming the results shown above which are derived from using the equations above.

Figure 7:
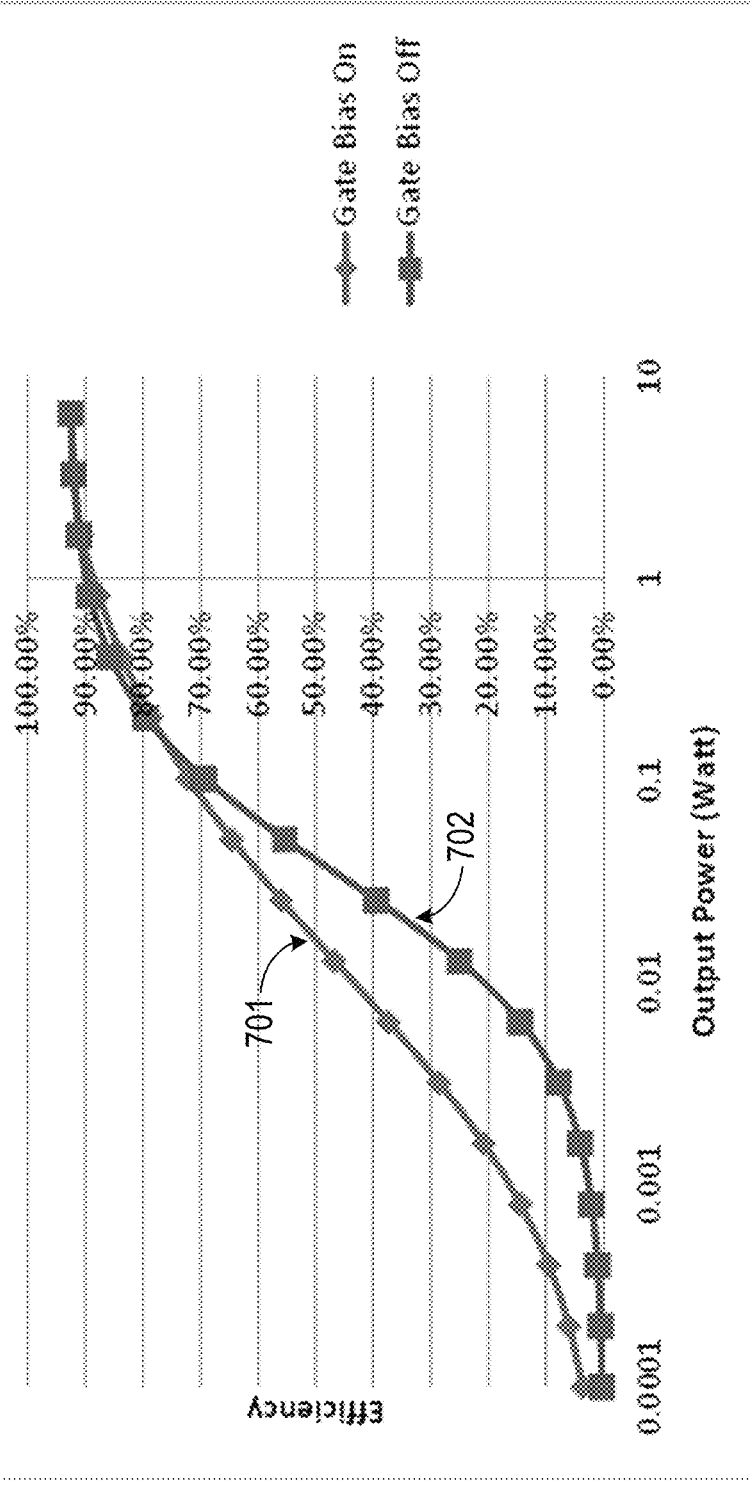
FIG. 7 is a diagram of simulated data illustrating the effect of optimum gate bias on the efficiency of a driver circuit according to an embodiment of the present invention.

FIG. 7 is a diagram of simulated data illustrating the effect of optimum gate bias on the efficiency of a driver circuit according to an embodiment of the present invention. In FIG. 7, curve 701 illustrates power efficiency of a driver circuit with the adaptive gate bias described above. Curve 702 illustrates power efficiency of a driver circuit without the adaptive gate bias described above. As shown, the adaptive gate bias results in significant efficiency improvement at low power levels.

Figure 8:
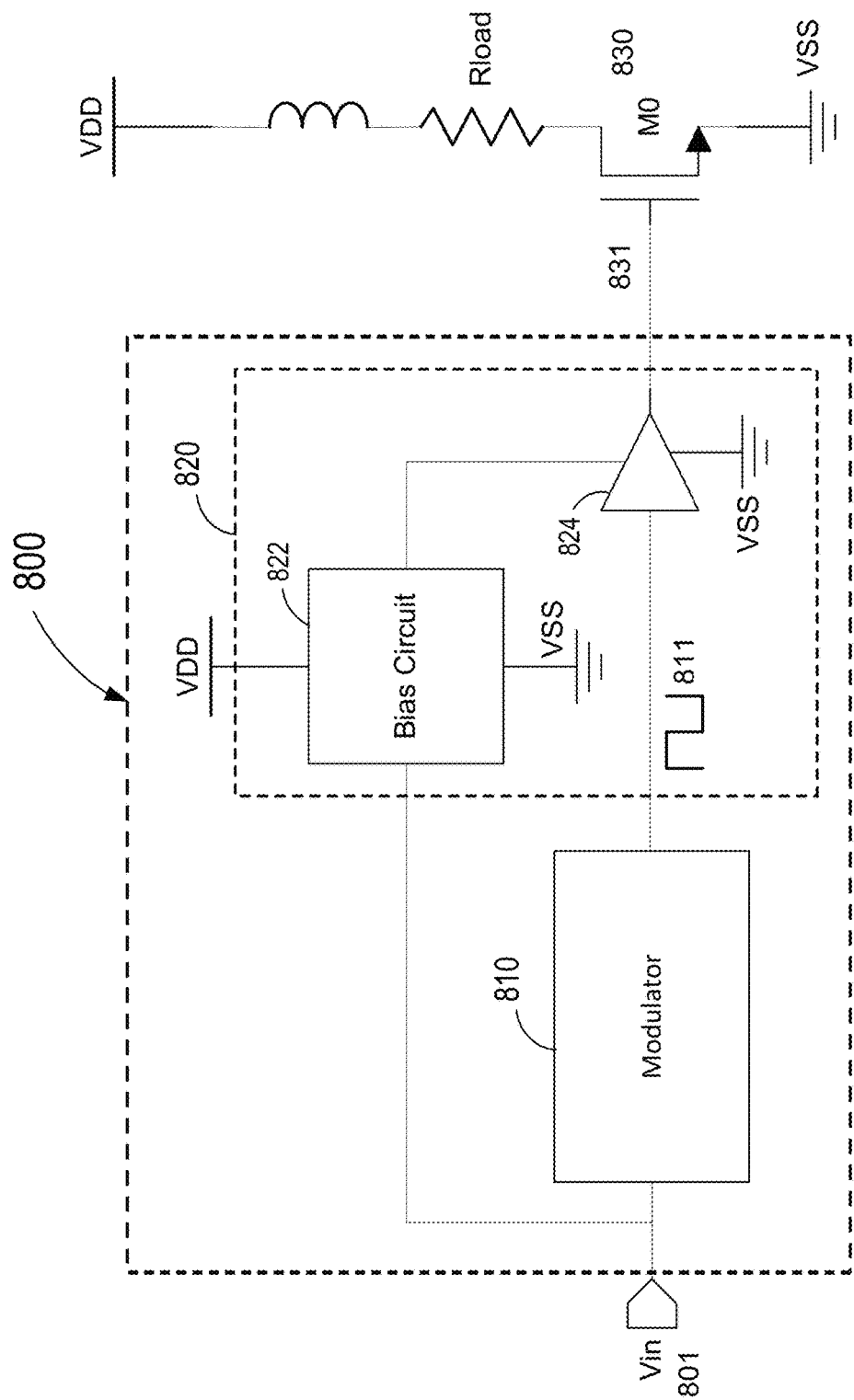
FIG. 8 is a simplified schematic diagram illustrating an audio driver circuit according to an embodiment of the present invention.

FIG. 8 is a simplified schematic diagram illustrating an audio driver circuit according to an embodiment of the present invention. As shown in FIG. 8, audio driver circuit 800 includes a modulator circuit 810 and a switched driver circuit 820. Modulator circuit 810 is configured to receive an audio input signal Vin (801) and produce a first modulated digital pulse signal 811. The first modulated digital pulse signal 811 has a magnitude that switches between a supply power voltage Vdd and a supply ground voltage Vss. In some cases, the supply ground voltage Vss can be at a ground voltage or 0 V. Switched driver circuit 820 is coupled to the modulator circuit 810 to receive the first modulated digital pulse signal 811 and configured to provide a second modulated digital pulse signal 831 for driving an MOS (metal oxide semiconductor) output transistor M0 (830). The second modulated digital pulse signal 831 has a same timing pattern as the first modulated digital pulse signal and has a magnitude that tracks linearly with the magnitude of the audio input signal Vin 801. In the example of FIG. 8, switched driver circuit 820 includes a bias circuit 822 and a gate driver circuit 824.

Figure 9:
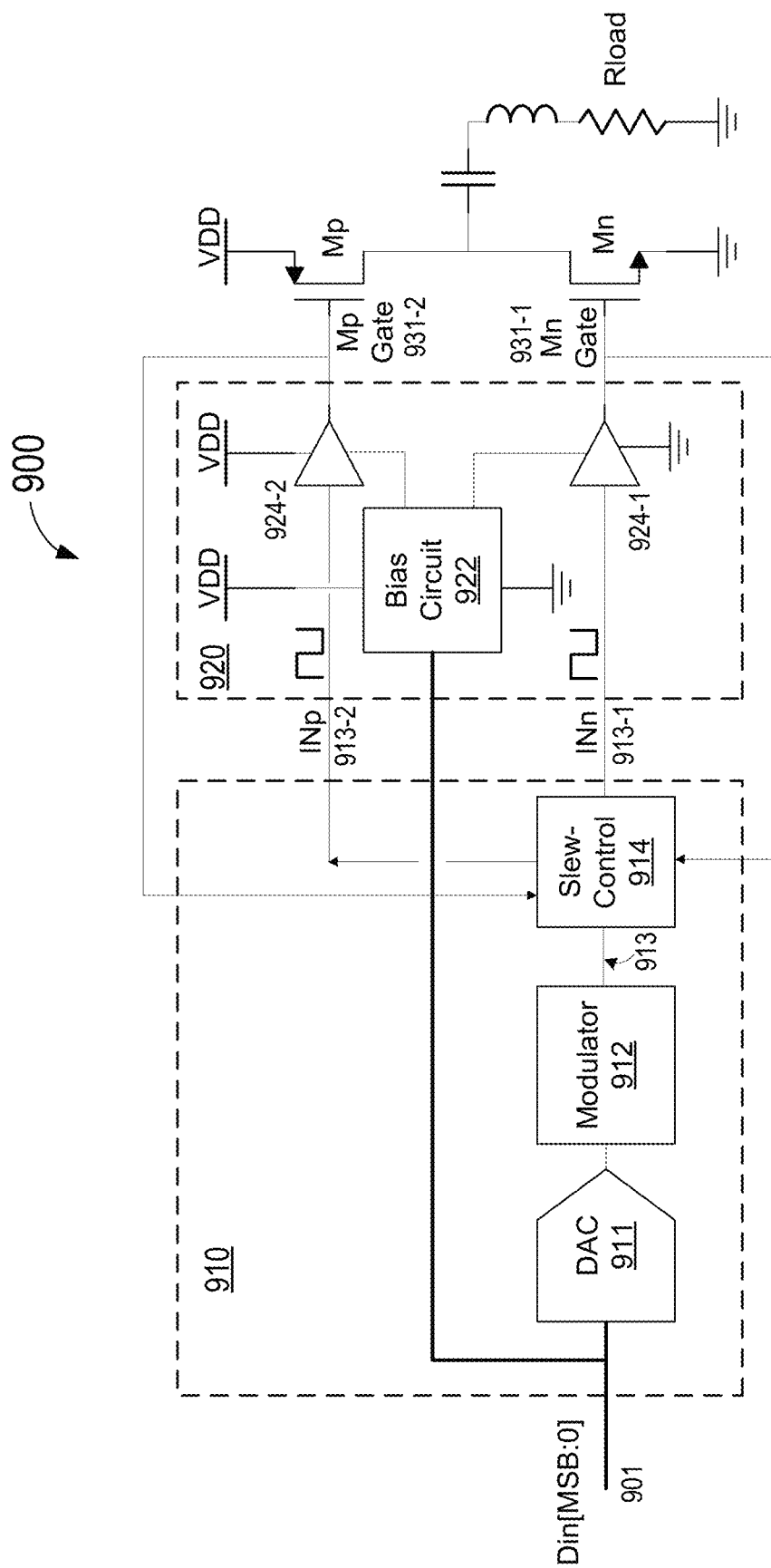
FIG. 9 is a more detailed schematic diagram illustrating an audio driver circuit according to another embodiment of the present invention.

FIG. 9 is a simplified schematic diagram illustrating an audio driver circuit according to another embodiment of the present invention. As shown in FIG. 9, audio driver circuit 900 includes a modulator circuit 910 and a switched driver circuit 920. Modulator circuit 910 is configured to receive an audio input signal 901. In this embodiment, audio input signal 901 is a digital representation Din[MSB:0] of an analog audio input signal Vin. For example, Din can be a binary representation having bits, numbered MSB to 0.

Modulator circuit 910 receives Din[MSB:0] at a DAC (Digital-to-Analog converter) 911, which drives a modulator 912, which, for example, can be a PWM modulator. The modulator output 913 then drives a slew rate control circuit 914, which determines the timing of the output signals from modulator 912.

Modulator circuit 910 is configured to produce a first modulated digital pulse signal 913. As shown, in this embodiment, the MOS output transistor is a CMOS output transistor including an NMOS transistor Mn and a PMOS transistor Mp. For driving the CMOS output transistor, the first modulated digital pulse signal 913 has two components, INn (913-1) for driving the NMOS output transistor Mn and INp (913-2) for driving the PMOS output transistor Mp. The INp and INn signals are logic signals which drive the Mp and Mn output drivers. The modulated digital pulse signals INn and INp have a magnitude that switches between a supply power voltage Vdd and a supply ground voltage Vss. In the example of FIG. 9, Vss is the ground voltage 0V.

In FIG. 9, switched driver circuit 920 is coupled to the modulator circuit 910 to receive the first modulated digital pulse signal 913, including 913-1 and 913-2 (INn and INp) and configured to provide a second modulated digital pulse signal 931, including pulse signals Mn Gate (931-1) and Mp Gate (931-2) for driving the NMOS output transistor Mn and the PMOS output transistor Mp, respectively. The second modulated digital pulse signal 931 has a same timing pattern as the first modulated digital pulse signal 913 and has a magnitude that tracks linearly with the magnitude of the audio input signal Vin 901 as represented by digital representation Din[MSB:0]. In the example of FIG. 9, switched driver circuit 920 includes a bias circuit 922 and a gate driver circuit 924, which includes a first gate driver circuit 924-1 for driving the NMOS output transistor Mn and a second gate driver circuit 924-2 for driving the PMOS output transistor Mp.

In FIGS. 8 and 9, simplified schematic diagrams of audio driver circuits 800 and 900 illustrate single ended drivers for simplicity. However, it is understood that, in other embodiments, a differential driver can be implemented to drive differential signals, for example, in a differential bridge-tied load configuration.

Figure 10:
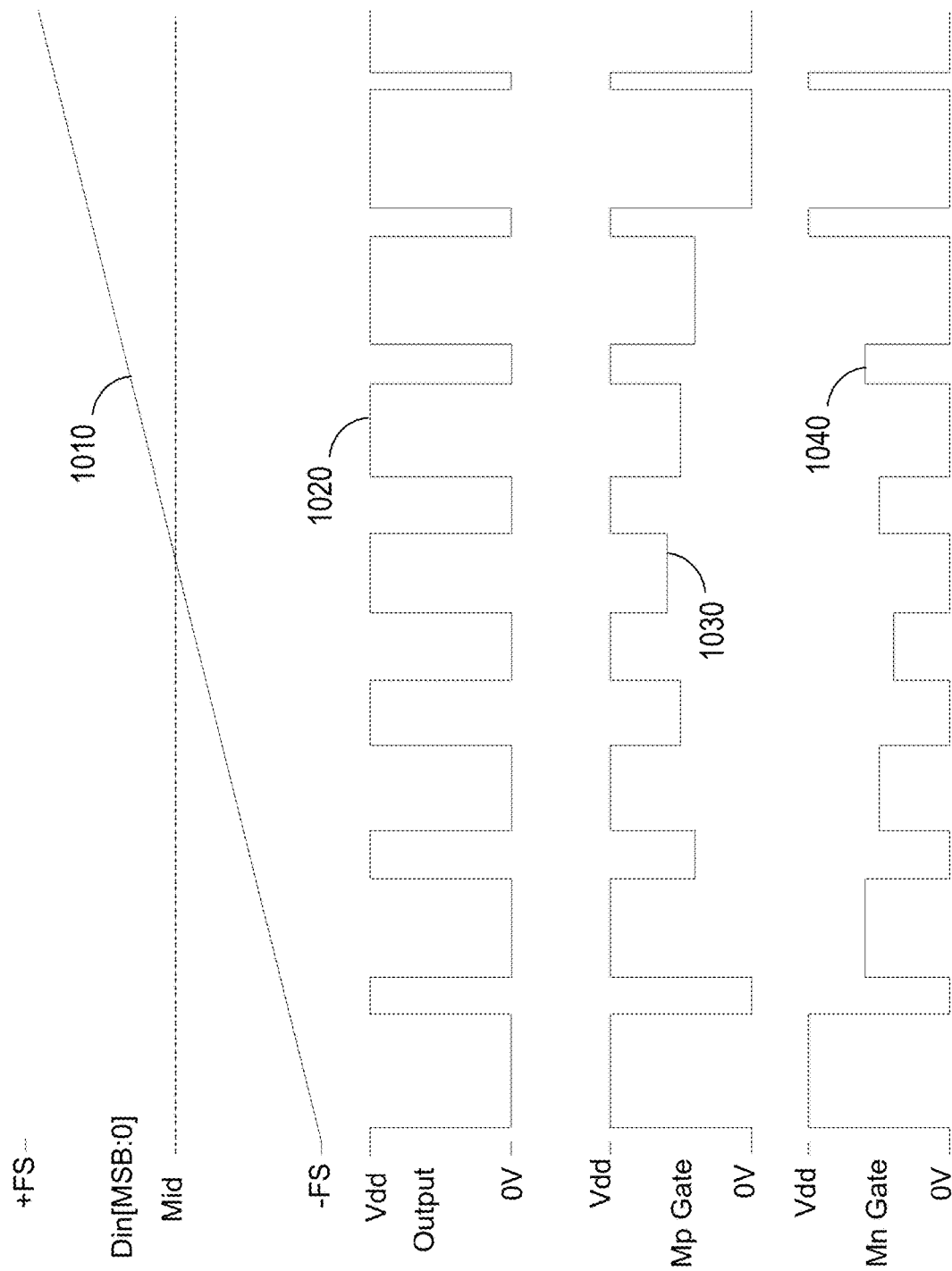
FIG. 10 is a waveform diagram illustrating an operation of the audio driver in FIG. 9 according to an embodiment of the present invention.

FIG. 10 is a waveform diagram illustrating an operation of audio driver circuit 900 in FIG. 9 according to an embodiment of the present invention. In FIG. 10, signal 1010 illustrates an audio input signal represented by Din [MSB:0], which varies between −FS (full scale) and +FS (full scale) with a mid-level Mid. Signal 1020 illustrates a first modulated digital pulse signal of audio input signal 1010. In this case, signal 1020 is a PWM (pulse width modulation) signal. It can be seen that the pulse width of signal 1020 increases as signal 1010 rises, moving to the right of the diagram. Further, signal 1020 has a magnitude that switches between a supply power voltage Vdd and a supply ground voltage Vss (0V in this case). Signal 1030 (Mp Gate for driving the PMOS output transistor) illustrates a second modulated digital pulse signal having a same timing pattern as the first modulated digital pulse signal 1020, e.g., a PWM signal. However, signal 1030 has a magnitude that tracks linearly with the magnitude of the audio input signal as represented by signal 1010. Here, the magnitude of the audio input signal refers to the variation of signal 1010 from the mid-level Mid. Similarly, signal 1040 (Mn Gate for driving the NMOS output transistor) illustrates a second modulated digital pulse signal having a same timing pattern as the first modulated digital pulse signal 1020, e.g., a PWM signal. However, signal 1040 has a magnitude that tracks linearly with the magnitude of the audio input signal as represented by signal 1010.

Figure 11:
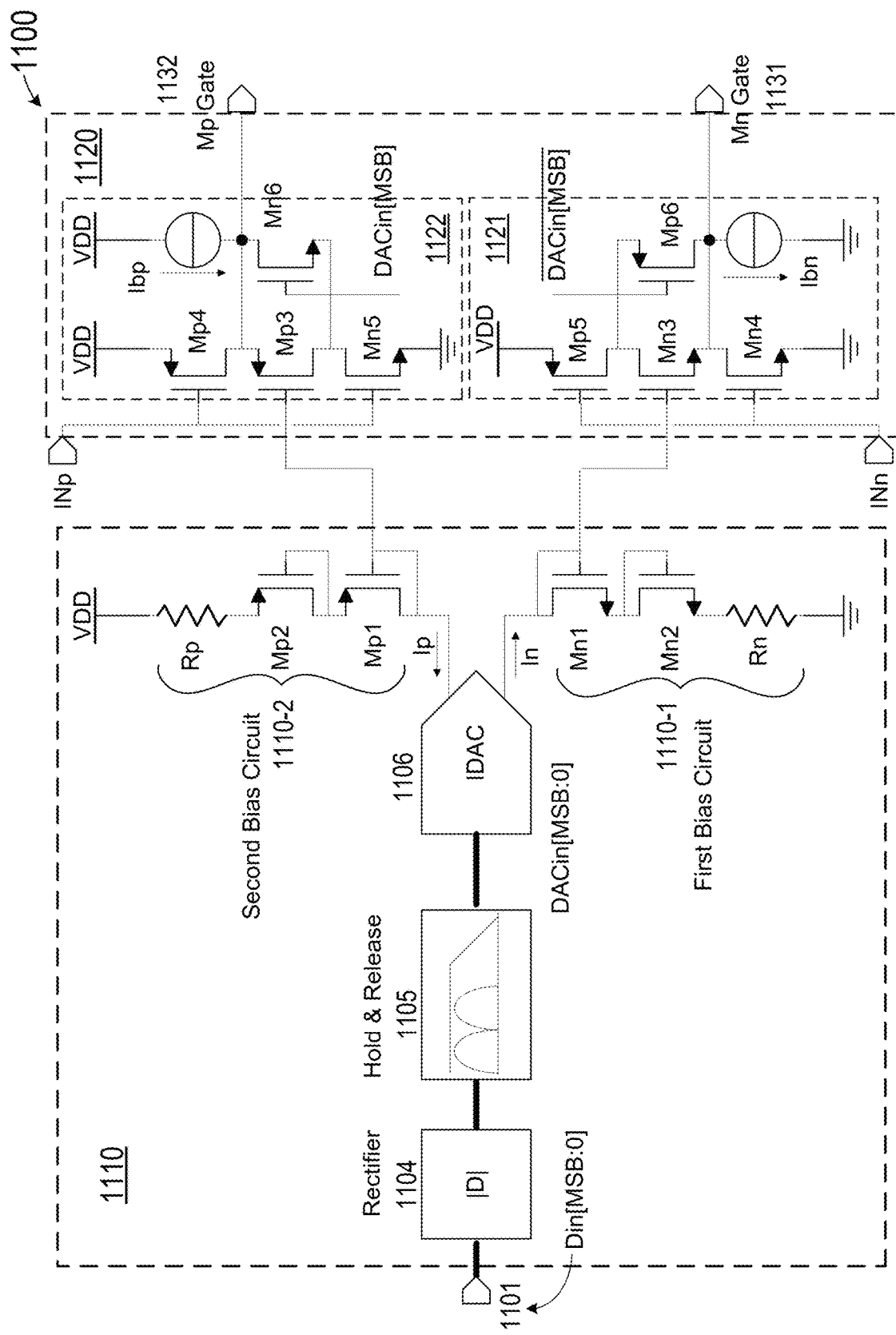
FIG. 11 is a simplified schematic diagram illustrating a switched driver circuit for an audio driver circuit according to an embodiment of the present invention.

FIG. 11 is a simplified schematic diagram illustrating a switched driver circuit for an audio driver circuit according to an embodiment of the present invention. As shown in FIG. 11, switched driver circuit 1100 is an example of a switched driver circuit that can be used to implement switched driver circuit 820 in FIG. 8 or switched driver circuit 920 in FIG. 9. Switched driver circuit 1100 is part of an audio driver that includes a modulator circuit similar to modulator circuit 910, but not shown in FIG. 11, which is configured to produce a first modulated digital pulse signal. In this embodiment, the MOS output transistor is a CMOS output transistor including an NMOS transistor Mn and a PMOS transistor Mp. For driving the CMOS output transistor, the first modulated digital pulse signal has two components, INn for driving the NMOS output transistor Mn and INp for driving the PMOS output transistor Mp. The first modulated digital pulse signal, which includes INn for driving the NMOS output transistor Mn and INp for driving the PMOS output transistor Mp has a magnitude, that switches between a supply power voltage Vdd and a supply ground voltage Vss (or ground).

Switched driver circuit 1100 includes a bias circuit 1110 and a gate driver circuit 1120. Bias circuit 1110 is configured to receive an audio input signal 1101 as a digital representation Din[MSB:0] of an analog audio input signal. Gate driver circuit 1120 is also configured to receive the first modulated digital pulse signals INn and INp, and configured to provide second modulated digital pulse signals, including pulse signals Mn Gate 1125 and Mp Gate 1126 for driving the NMOS output transistor and the PMOS output transistor, respectively (not shown in FIG. 11). The second modulated digital pulse signals have a same timing pattern as the first modulated digital pulse signal INn and INp and have a magnitude that tracks linearly with the magnitude of the audio input signal 1101 as represented by digital representation Din[MSB:0].

Bias circuit 1110 includes a rectifier for receiving the digital representation of the audio input signal and outputting an absolute value of the audio input signal. Bias circuit 1110 also includes a rectifier 1104, a hold and release circuit 1105, and a digital-to-analog current converter (IDAC) 1106. Bias circuit 1110 is configured for providing a first analog current signal In and a second analog current signal Ip based on the absolute value of the audio input signal. In some embodiments, the magnitude of In and Ip are proportional to the absolute value of the audio input signal. The IDAC or Digital to Analog Current Converter is also known as a current steering DAC in the art. It can embody a digital input signal bus, for which each bit can enable a binary weighted current source from a set of binary weighted current sources. The most significant bit (MSB) enables the current source with the most weight and the least significant bit (LSB) enables the current source with the least weight. The output current of the IDAC is often fed into a resistor load in order to produce an output voltage.

As shown in FIG. 11, bias circuit 1110 includes a first bias circuit 1110-1 and a second bias circuit 1110-2. The first bias circuit 1101 is coupled to a first gate driver circuit 1121 for providing a first gate driver voltage Mn to the NMOS output transistor 1131 (Mn Gate). The second bias circuit 1102 is coupled to a second gate driver circuit 1122 for providing a second gate driver voltage 1132 (Mp Gate) to the PMOS output transistor.

The first bias circuit 1101 includes a first NMOS transistor Mn1, a second NMOS transistor Mn2, and a first resistor Rn connected in series. Each of the first NMOS transistor Mn1 and the second NMOS transistor Mn2 is a diode-connected NMOS transistor with a gate node connected to a drain node. The second bias circuit 1102 includes a first PMOS transistor Mp1, a second PMOS transistor Mp2, and a second resistor Rp connected in series. Each of the first PMOS transistor Mp1 and the second PMOS transistor Mp2 is a diode-connected PMOS transistor with a gate node connected to a drain node.

In FIG. 11, gate driver circuit 1120 includes a first gate driver circuit 1121 for driving the NMOS output transistor Mn and a second gate driver circuit 1122 for driving the PMOS output transistor Mp. The first gate driver circuit 1121 includes a fifth PMOS transistor Mp5, a third NMOS transistor Mn3, and a fourth NMOS transistor Mn4 connected in series, and a sixth PMOS transistor Mph. A gate node of the third NMOS transistor Mn3 is coupled to a gate node of the first NMOS transistor Mn1. A drain node of the fifth PMOS transistor Mp5 is coupled to a source of the sixth PMOS transistor Mp6. A source node of third NMOS transistor Mn3 is coupled to a first output terminal Mn Gate for providing the first gate driver voltage, and a drain node of the sixth PMOS transistor Mp6 is coupled to the first output terminal.

The second gate driver circuit 1122 comprises a fifth NMOS transistor Mn5, a third PMOS transistor Mp3, and a fourth PMOS transistor Mp4 connected in series, and a sixth NMOS transistor Mn6. A gate node of the third PMOS transistor Mp3 is coupled to a gate node of the first PMOS transistor Mp1. A source node of third PMOS transistor Mp3 is coupled to a second output terminal (Mp Gate) for providing the second gate driver voltage. A drain node of the fifth NMOS transistor Mn5 is coupled to a source of the sixth NMOS transistor Mn6. A source node of third PMOS transistor Mp3 is coupled to a second output terminal (Mp Gate) for providing the second gate driver voltage. A drain node of the sixth PMOS transistor Mp6 is coupled to the first output terminal.

In FIG. 11, transistors Mn1 and Mn2 are diode-connected transistors, and they are coupled in series as resistor Rn. The gate of Mn3 is connected to Mn1, and the source voltage of Mn3 is the gate drive voltage Mn Gate. The threshold voltage of the second NMOS transistor Mn2 is configured to match a threshold voltage of a first output transistor Mn. A threshold voltage of the second PMOS transistor Mp2 is configured to match a threshold voltage of a first second transistor Mp.

The digital representation of the input signal Din[MSB:0] is digitally rectified by rectifier 1104. This can be done by ignoring the sign for a sign magnitude representation. Hold and release circuit 1105 keeps the DACin[MSB:0] at the peak level of the rectified Din[MSB:0] signal for a given hold time before it releases the DACin[MSB:0] to reduce its level. This is due to the reactive speaker load. Even though the input level goes down, it takes some extra time for the reactive load current to go down. During this time the driver has to be in a lower on-resistance state to deal with the load current. The DACin[MSB:0] is fed into the current DAC (IDSC) 1106, which provides a signal current proportional to DACin[MSB:0] into the stacked series transistor-resistor paths for the P and N drivers. For the N-driver the current flows into Mn1, Mn2 and Rn. When INn=0, MPS turns on, MN4 turns off, and the Mn Gate is biased to:

$$Vmngate = Vgsn1 + Vgsn2 + In \times Rn - Vgsn3.$$

The current Ibn and the dimensions of Mn3 are chosen such that Vgsn1=Vgsn3. Also, Mn2 is made to match with the NMOS output transistor Mn, and Mn2 is made large enough such that Vgsn2=Vt of NMOS output transistor Mn. Then, Vmngate becomes:

$$Vmngate = Vt + In \times Rn.$$

The slope of In×Rn can now be chosen to meet the requirement for optimal efficiency derived above. A similar equation can be derived for the complementary P driver:

$$Vmpgate = VDD - (Vt + Ip \times Rp).$$

Note that, for high input levels when DACin[MSB]=1, the bias circuit is bypassed and the gates are driven to VDD and VSS, respectively.

It can be seen that the gate drive voltage Mn Gate is equal to In×Rn+Vt, where Vt is the threshold voltage of Mn2. In is proportional to input audio voltage Vin. In addition, in a linear amplifier used for audio circuit, Vout is proportional to Vin. In is proportional to input audio voltage Vin. In addition, in a linear amplifier used for audio circuit, Vout is proportional to Vin, and optimum Vgs bias has a linear relationship with the input voltage. As a result, the gate drive voltage Mn Gate is set at the optimum gate value for power efficiency.

The operation of the circuit in FIG. 11 can be further explained with reference to the waveforms in FIG. 10. As Din[MSB:0] ramps up from negative Full Scale to Positive Full Scale, the Mn Gate and Mp Gate signals start at full swing between Vdd and 0V. As the magnitude of the input signal becomes smaller, the MSB of the signed magnitude rectified input turns off and the Mp Gate and Mn Gate signals switch to the input proportional bias voltages. When the magnitude of Din[MSB:0] reaches 0, the Mp Gate and Mn Gate bias levels are at the minimum and increase again as Din[MSB:0] increases towards positive Full Scale. At some point, the MSB of the signed magnitude rectified input turns on and the Mp Gate and Mn Gate signals switch to the Vdd and 0V levels again.

Figure 12:
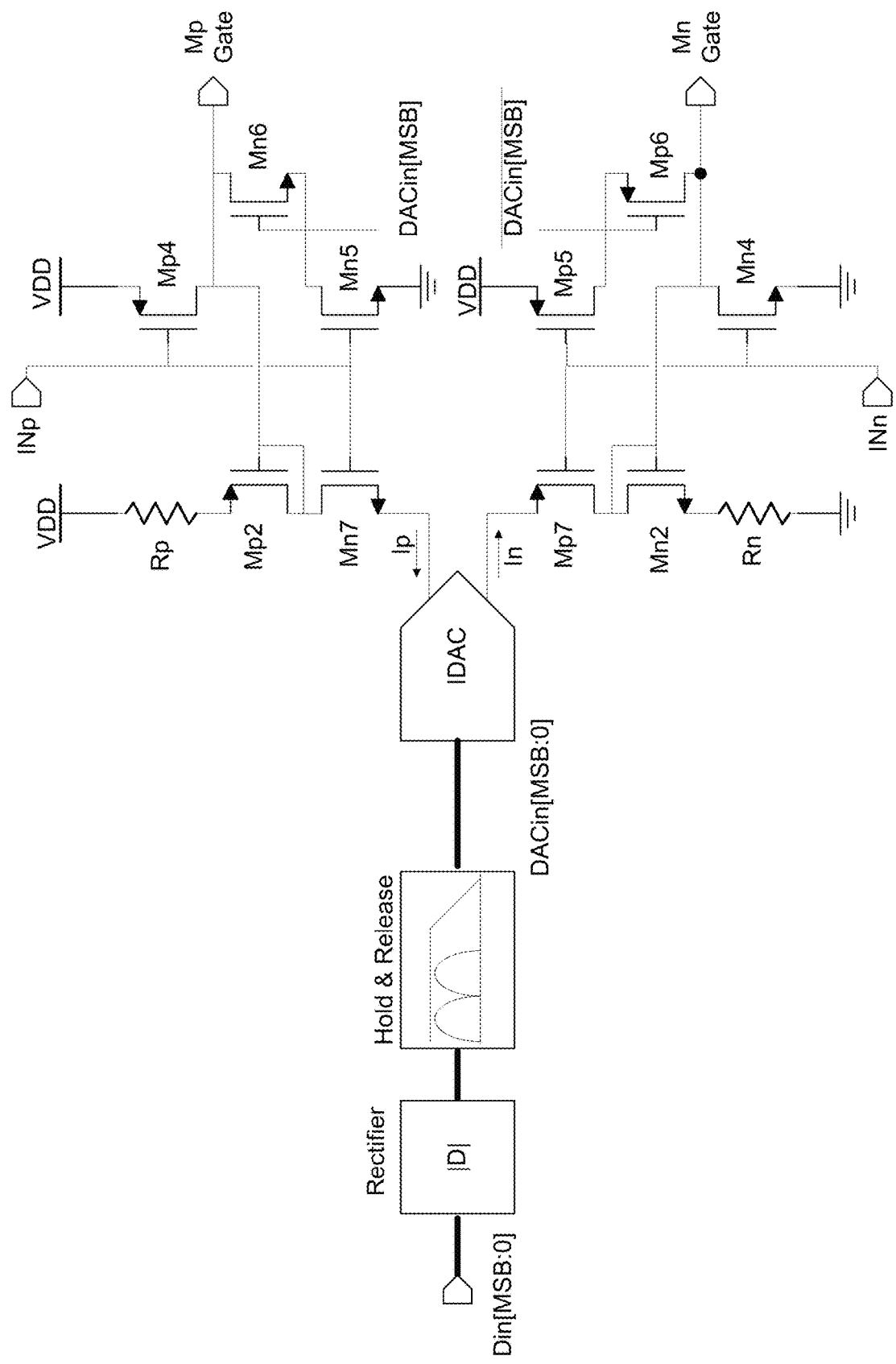
FIG. 12 is a simplified schematic diagram illustrating a switched driver circuit for an audio driver circuit according to another embodiment of the present invention.

FIG. 12 is a simplified schematic diagram illustrating a switched driver circuit for an audio driver circuit according to another embodiment of the present invention. As shown in FIG. 12, switched driver circuit 1200 is another example of a switched driver circuit that can be used to implement switched driver circuit 820 in FIG. 8 or switched driver circuit 920 in FIG. 9. Switched driver circuit 1200 is similar to switched driver circuit 1100 in FIG. 11, with some modifications. For example, transistors Mn1 and Mp1 in switched driver circuit 1100 in FIG. 11 are replaced by transistors Mp7 and Mn7 in switched driver circuit 1100 in FIG. 12. The gates of Mp7 and Mn7 are coupled to the gates of Mn4 and Mp4, respectively, in switched driver circuit 1100 in FIG. 12. Further, transistors Mn3 and Mp3 in switched driver circuit 1100 in FIG. 11 are absent in switched driver circuit 1100 in FIG. 12. In switched driver circuit 1100 in FIG. 11, the output currents are provided by pull-up currents sources Ibn and Ibp, respectively. In contrast, in switched driver circuit 1200 in FIG. 12, the output currents are provided by the IDAC.

In FIG. 12, the IDAC is only driving one switch, a diode-connected MOS device and a resistor, allowing for the IDAC to run on a lower supply voltage other than VDD. This embodiment can save additional power. However, the large Mn and Mp driver gates are no longer driven by source follower devices, and this can have an impact on the effects of the parasitic gate to drain capacitance when the outputs are switching. For the large Mn device, the gate to drain capacitance could drag down the Mn2 gate voltage when the output goes low while the Mn gate is going up.

According to some embodiments of the present invention, a method for providing an audio driver signal to an output transistor includes receiving an audio input signal, at a modulator circuit, and producing a first modulated digital pulse signal. The first modulated digital pulse signal has a magnitude that switches between a supply power voltage and a supply ground voltage. The method also includes receiving, at a switched driver circuit, the first modulated digital pulse signal and providing a second modulated digital pulse signal for driving an output transistor. The second modulated digital pulse signal has a same timing pattern as the first modulated digital pulse signal and has a magnitude that tracks linearly with the magnitude of the audio input signal.

Examples of the method are described above in connection with FIGS. 6-12, and accompanying text. For example, the method was illustrated by the waveform in FIG. 10 and the circuit schematic diagram in FIG. 11.

In some embodiments of the above method, a magnitude of the second modulated digital pulse signal is low at low audio input voltage, and thereby is configured to improve power efficiency at low output power levels.

In some embodiments, the first modulated digital pulse signal and the second modulated digital pulse signal are pulse width modulation (PWM) signals.

In some embodiments, the method also includes providing a current signal through a serially-coupled transistor and resistor pair to produce a voltage signal. The current signal is proportional to the audio input signal, and the voltage signal can be expressed as:

$$I*R + Vt;$$

where:
I is the current proportional to the audio input signal;
R is the resistance of the resistor; and
Vt is a threshold voltage, equivalent to the threshold voltage of the output transistor.

In the circuit schematic diagram in FIG. 11, a first serially-coupled transistor and resistor pair includes transistor Mn2 and resistor Rn. A second serially-coupled transistor and resistor pair includes transistor Mp2 and resistor Rp.

Although the above embodiments have been described using a selected group of components for an audio driver circuit, there can be many alternatives, modifications, and variations. For example, the driver circuit examples illustrated in FIGS. 6-12 utilize single-ended driver circuits. However, it is understood that differential driver circuits can be implemented using similar circuit structures with transistors and signal polarities adjusted accordingly. Moreover, even though, in the examples described above, the modulated digital pulse signals are pulse width modulation (PWM) signals, it is understood that other forms of modulated digital pulse signals can also be used, for example, pulse frequency modulation (PFM) signals. Furthermore, the invention described here is not limited to non-boosted switching drivers. For example, in some embodiments, boosted switching drivers are also contemplated, and a similar efficiency improvement is expected. In some embodiments, a driver that combines the adaptive gate bias with a segmented driver can be implemented, and greater efficiency improvement can be expected.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An audio driver circuit, comprising:
   a modulator circuit configured to receive an audio input signal, comprising:
   a digital-to-analog converter (DAC) circuit for receiving a digital representation of an audio input voltage signal and outputting an analog audio input signal;
   a class-D PWM (pulse width modulation) modulator configured for receiving the analog audio input signal and generating a first PWM signal, wherein the first PWM signal has a magnitude switching between a supply power voltage and a supply ground voltage;
   a switched driver circuit for driving a MOS (metal oxide semiconductor) output transistor, the MOS output transistor having a source node coupled to either the supply power voltage or the supply ground voltage and a drain node coupled to an audio driver output node, the switched driver circuit being coupled to the audio input voltage signal and the modulator circuit, the switched driver circuit comprising:
   a digital-to-analog current converter (IDAC) circuit configured to provide a current signal proportional to the magnitude of the audio input voltage signal; and
   a MOS transistor and a resistor coupled in series to receive the current signal;
   wherein the switched driver circuit is configured to provide a gate bias voltage to a gate node of the MOS output transistor, wherein the gate bias voltage is a second PWM signal that has a same timing pattern as the first PWM signal and has a magnitude that is linearly proportional to the magnitude of the audio input voltage signal.

2. The audio driver circuit of claim 1, wherein the gate bias voltage is expressed as:

$I*R+Vt;$ wherein:
   I is an IDAC output current;
   R is the resistance of the resistor; and
   Vt is a threshold voltage, equivalent to the threshold voltage of the MOS output transistor.

3. The audio driver circuit of claim 2, wherein the switched driver circuit further comprises:
   a rectifier for receiving a digital representation of the audio input signal and outputting an absolute value of the audio input signal; and
   a hold-and-release circuit for keeping the absolute value of the audio input signal at a peak level for a given hold time before releasing the absolute value of the audio input signal to the digital-to-analog current converter (IDAC).

4. The audio driver circuit of claim 1, wherein the switched driver circuit is configured for driving an NMOS output transistor and a PMOS transistor.

5. An audio driver circuit, comprising:
   a modulator circuit configured to receive an audio input signal and produce a first modulated digital pulse signal, the first modulated digital pulse signal having a magnitude that switches between a supply power voltage and a supply ground voltage; and
   a switched driver circuit coupled to the modulator circuit to receive the first modulated digital pulse signal and configured to provide a second modulated digital pulse signal for driving a MOS (metal oxide semiconductor) output transistor, wherein the second modulated digital pulse signal has a same timing pattern as the first modulated digital pulse signal and has a magnitude that tracks linearly with the magnitude of the audio input signal.

6. The audio driver circuit of claim 5, wherein a magnitude of the second modulated digital pulse signal is low at low audio input voltage, and thereby is configured to improve power efficiency at low output power levels.

7. The audio driver circuit of claim 5, wherein the first modulated digital pulse signal and the second modulated digital pulse signal are pulse width modulation (PWM) signals.

8. The audio driver circuit of claim 5, wherein the first modulated digital pulse signal and the second modulated digital pulse signal are pulse frequency modulation (PFM) signals.

9. The audio driver circuit of claim 5, wherein the switched driver circuit is configured to provide a current signal through a serially-coupled MOS transistor and resistor pair to produce a voltage signal, wherein the current signal is proportional to the audio input signal, and the voltage signal is expressed as:

$I*R+Vt;$ wherein:
   I is the current signal proportional to the audio input signal;
   R is the resistance of the resistor; and
   Vt is a threshold voltage, equivalent to the threshold voltage of the MOS output transistor.

10. The audio driver circuit of claim 9, wherein the switched driver circuit comprises:
    a bias circuit configured to generate the voltage signal expressed as I*R+Vt; and
    a gate driver circuit configured to receive the voltage signal from the bias circuit and to provide the second modulated digital signal.

11. The audio driver circuit of claim 10, wherein the bias circuit comprises:
    a first bias circuit coupled to a first gate driver circuit for providing a first gate driver voltage to an NMOS output transistor; and
    a second bias circuit coupled to a second gate driver circuit for providing a second gate driver voltage to a PMOS output transistor.

12. The audio driver circuit of claim 11, wherein:
    the first bias circuit comprises a first NMOS transistor Mn1, a second NMOS transistor Mn2, and a first resistor Rn connected in series, each of the first NMOS transistor Mn1 and the second NMOS transistor Mn2 being a diode-connected NMOS transistor with a gate node connected to a drain node; and
    the second bias circuit comprises a first PMOS transistor Mp1, a second PMOS transistor Mp2, and a second resistor Rp connected in series, each of the first PMOS transistor Mp1 and the second PMOS transistor Mp2 being a diode-connected NMOS transistor with a gate node connected to a drain node.

13. The audio driver circuit of claim 12, wherein the first gate driver circuit comprises a fifth PMOS transistor Mp5, a third NMOS transistor Mn3, and a fourth NMOS transistor Mn4 connected in series, and a sixth PMOS transistor Mp6, wherein:
a gate node of the third NMOS transistor Mn3 is coupled to a gate node of the first NMOS transistor Mn1;
a drain node of the fifth PMOS transistor Mp5 is coupled to a source of the sixth PMOS transistor Mp6;
a source node of third NMOS transistor Mn3 is coupled to a first output terminal Mn Gate for providing the first gate driver voltage; and
a drain node of the sixth PMOS transistor Mp6 is coupled to the first output terminal.

14. The audio driver circuit of claim 13, wherein the second gate driver circuit comprises a fifth NMOS transistor Mn5, a third PMOS transistor Mp3, and a fourth PMOS transistor Mp4 connected in series, and a sixth NMOS transistor Mn6, wherein:
a gate node of the third PMOS transistor Mp3 is coupled to a gate node of the first PMOS transistor Mp1;
a source node of third PMOS transistor Mp3 is coupled to a second output terminal (Mp Gate) for providing the second gate driver voltage;
a drain node of the fifth NMOS transistor Mn5 is coupled to a source of the sixth NMOS transistor Mn6;
a source node of third PMOS transistor Mp3 is coupled to a second output terminal (Mp Gate) for providing the second gate driver voltage; and
a drain node of the sixth PMOS transistor Mp6 is coupled to the first output terminal.

15. The audio driver circuit of claim 14, wherein:
a threshold voltage of the second NMOS transistor Mn2 is configured to match a threshold voltage of a first output transistor Mn; and
a threshold voltage of the second PMOS transistor Mp2 is configured to match a threshold voltage of a first second transistor Mp.

16. The audio driver circuit of claim 11, the bias circuit further comprising:

a rectifier for receiving a digital representation of the audio input signal and outputting an absolute value of the audio input signal; and
a digital-to-analog current converter (IDAC) for providing a first analog current signal and a second analog current signal based on the absolute value of the audio input signal.

17. A method, comprising:
receiving an audio input signal, at a modulator circuit, and producing a first modulated digital pulse signal, the first modulated digital pulse signal having a magnitude that switches between a supply power voltage and a supply ground voltage; and
receiving, at a switched driver circuit, the first modulated digital pulse signal and providing a second modulated digital pulse signal for driving an output transistor, wherein the second modulated digital pulse signal has a same timing pattern as the first modulated digital pulse signal and has a magnitude that tracks linearly with the magnitude of the audio input signal.

18. The method of claim 17, wherein a magnitude of the second modulated digital pulse signal is low at low audio input voltage, and thereby is configured to improve power efficiency at low output power levels.

19. The method of claim 17, wherein the first modulated digital pulse signal and the second modulated digital pulse signal are pulse width modulation (PWM) signals.

20. The method of claim 17, further comprising providing a current signal through a serially-coupled transistor and resistor pair to produce a voltage signal, wherein the current signal is proportional to the audio input signal, and the voltage signal is expressed as:

$$I*R+Vt;$$

wherein:
I is a current proportional to the audio input signal;
R is the resistance of the resistor; and
Vt is a threshold voltage, equivalent to the threshold voltage of the output transistor.

* * * * *